United States Patent
Golman et al.

(10) Patent No.: US 6,574,496 B1
(45) Date of Patent: Jun. 3, 2003

(54) MAGNETIC RESONANCE IMAGING

(75) Inventors: Klaes Golman, Malmo (SE); Oskar Axelsson, Malmo (SE); Haukur Johannesson, Malmo (SE)

(73) Assignee: Amersham Health AS, Oslo (NO)

( * ) Notice: Subject to any disclaimer, the term of this patent is extended or adjusted under 35 U.S.C. 154(b) by 0 days.

(21) Appl. No.: 09/572,949

(22) Filed: May 18, 2000

Related U.S. Application Data

(60) Provisional application No. 60/139,303, filed on Jun. 15, 1999.

(30) Foreign Application Priority Data

May 19, 1999 (GB) .............................. 9911679

(51) Int. Cl.[7] .................................. A61B 5/05
(52) U.S. Cl. ..................... 600/420; 324/307; 324/309; 424/9.3
(58) Field of Search ................ 600/420, 410; 324/307, 309; 424/9.3

(56) References Cited

U.S. PATENT DOCUMENTS 5,322,065 A  *  6/1994  Leunbach ................... 600/420
6,278,893 B1 *  8/2001  Ardenkjaer-Larson et al. ... 324/307

FOREIGN PATENT DOCUMENTS

EP   0 665 282 A      8/1995
GB   WO 00/71166 A2 * 5/2000 .......... A61K/49/00

OTHER PUBLICATIONS

Casanova et al., "Phenylacetylene–1–13C", Organic Preparations and Procedures, 1969, XP002094734.
Baldwin et al., "Synthesis of chiral isoxazolidin–5–ones and their applications to the synthesis of beta–amino–alanines and beta–(N–hydroxyamino)–alanines", Tetrahedron, 1994, XP002094735.
Jordan et al., "Mechanistic and stereochemical investigation of fatty acid and polyketide biosynthesis using chiral malonates", Tetrahedron, 1991, XP002094736.
Bottomley P.A. et al., "Proton–decoupled, overhauser–enhanced, spatially localized carbon–13 spectroscopy in humans", Magnetic Resonsnace in Medicine, Dec. 1, 1989.
Barkemeyer et al., "Hetero–NMR enhancement via parahydrogen", J. Am. Chem. Soc., 1995, XP002094737.

* cited by examiner

Primary Examiner—Marvin M. Lateef
Assistant Examiner—Jeoyuh Lin

(57) ABSTRACT

A method of magnetic resonance investigation of a sample by (i) reacting ortho-deuterium enriched hydrogen with a hydrogenatable MR imaging agent precursor to produce a hydrogenated (i.e. deuterated) MR imaging agent; (ii) optionally, subjecting the hydrogenated MR imaging agent to a low magnetic field;(iii) administering the hydrogenated MR imaging agent to the sample; (iv) exposing the sample to radiation of a frequency selected to excite nuclear spin transitions of selected non-zero nuclear spin nuclei in said hydrogenated MR imaging agent; (v) detecting magnetic resonance signals of the selected non-zero nuclear spin nuclei from the sample; and (vi) optionally, generating an image or biological functional data or dynamic flow data from the detected signals.

19 Claims, 5 Drawing Sheets

Figure 2A:
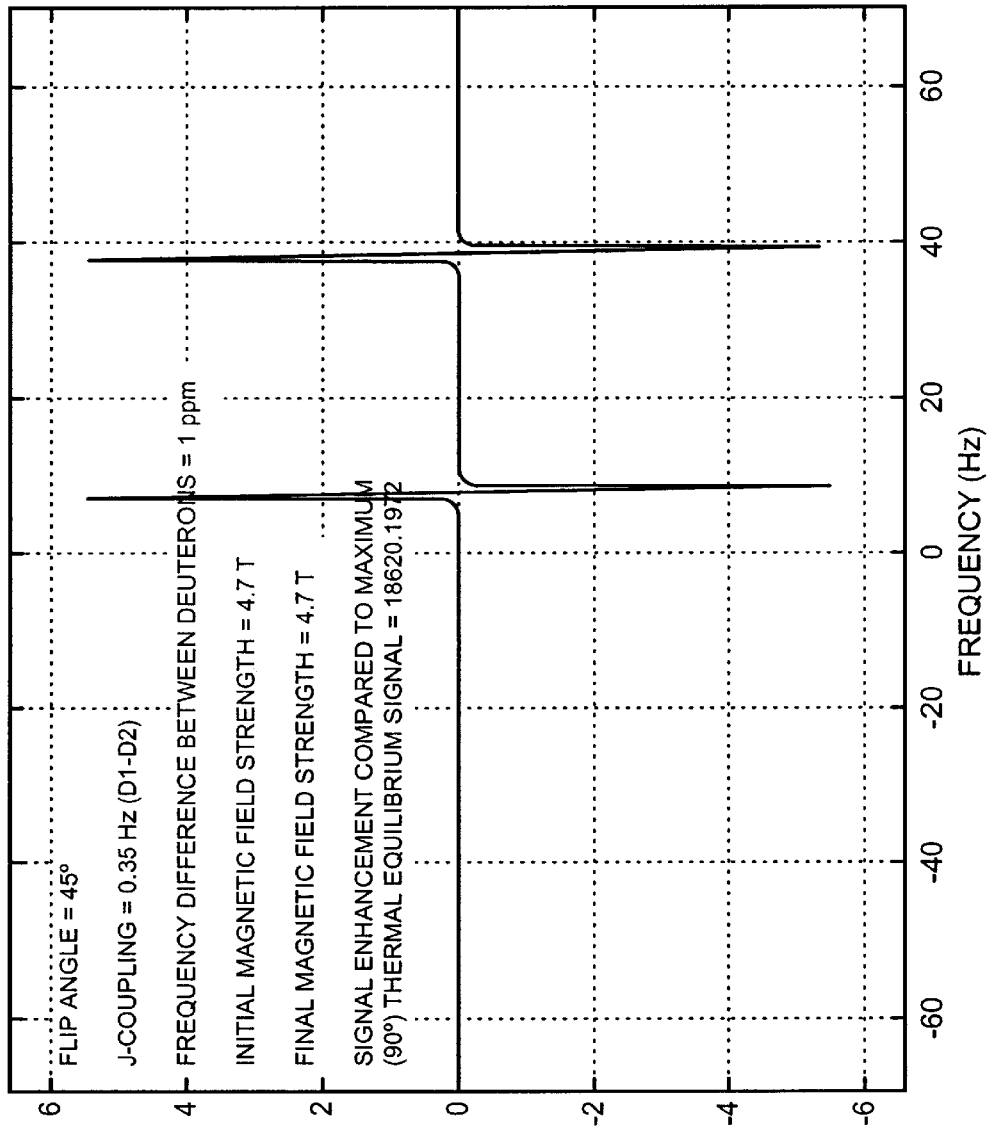

FRACTION OF ORTHO-DEUTERIUM IN AN EQUILIBRIUM MIXTURE AS A FUNCTION OF TEMPERATURE

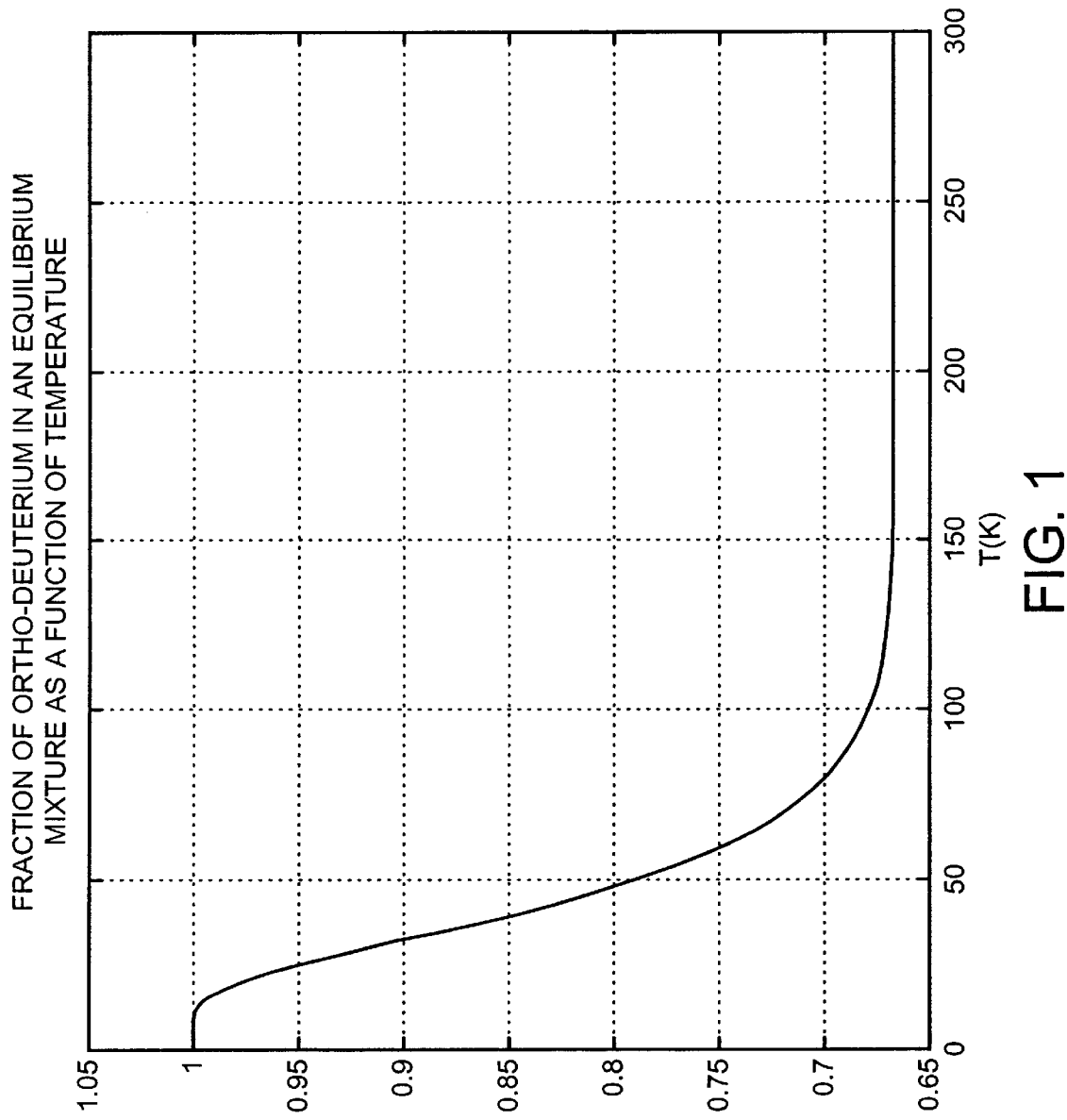

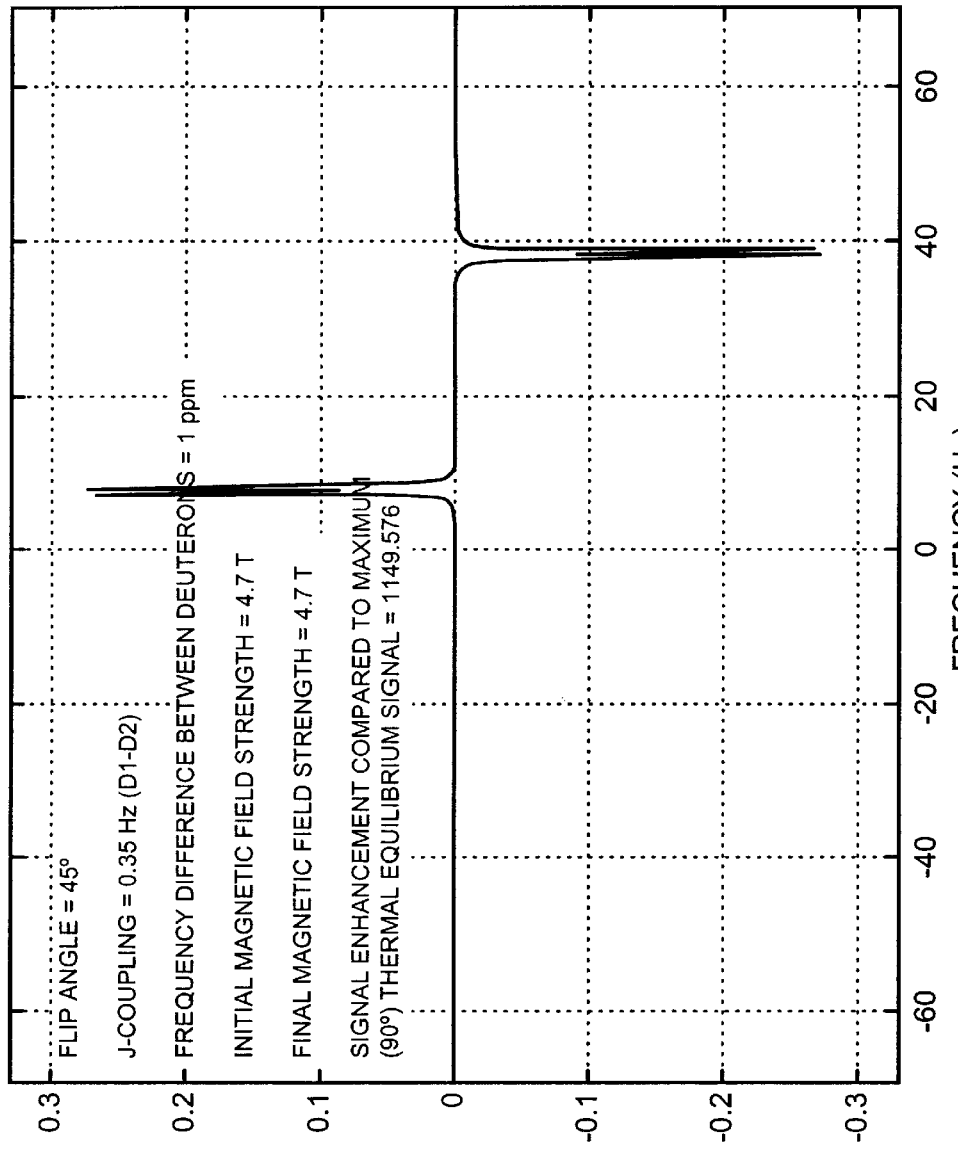

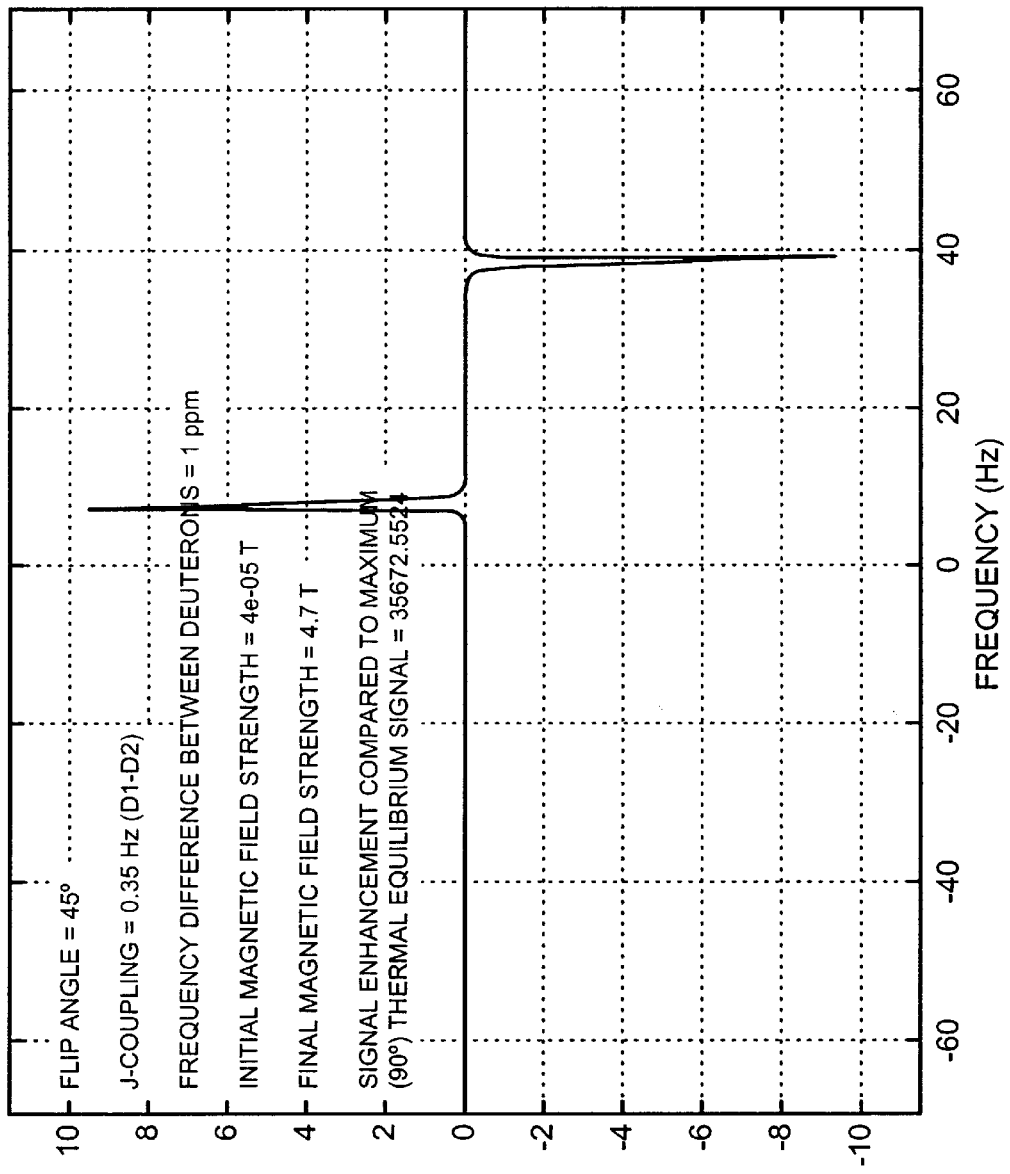

MAGNETIC RESONANCE IMAGING

This application claims benefit under 35 U.S.C. 119(e) of provisional application No. 60/139,303, filed Jun. 15, 1999.

This invention relates to a method of magnetic resonance imaging (MRI), in particular to magnetic resonance imaging of deuterium and nuclei with I (nuclear spin)=½, e.g. $^1H$, $^{13}C$, $^{15}N$ and $^{29}Si$.

Magnetic resonance imaging is a diagnostic technique that has become particularly attractive to physicians as it is non-invasive and does not involve exposing the patient under study to potentially harmful radiation such as X-rays.

In order to achieve effective contrast between MR images of different tissue types, it has long been known to administer to the subject MR contrast agents (e.g. paramagnetic metal species) which affect relaxation times in the zones in which they are administered or at which they congregate. By shortening the relaxation times of the imaging nuclei (the nuclei whose MR signal is used to generate the image) the strength of the MR signal is changed and image contrast is enhanced.

MR signal strength is also dependent on the population difference between the nuclear spin states of the imaging nuclei. This is governed by a Boltzmann distribution and is dependent on temperature and magnetic field strength. However, in MR imaging contrast enhancement has also been achieved by utilising the "Overhauser effect" in which an esr transition in an administered paramagnetic species is coupled to the nuclear spin system of the imaging nuclei. The Overhauser effect (also known as dynamic nuclear polarisation) can significantly increase the population difference between excited and ground nuclear spin states of the imaging nuclei and thereby amplify the MR signal intensity. Most of the Overhauser contrast agents disclosed to date are radicals which are used to effect polarisation of imaging nuclei in vivo. There is very little reported work on techniques which involve ex vivo polarisation of imaging nuclei prior to administration and MR signal measurement.

U.S. Pat. No. 5,617,859 (Souza) discloses a magnetic resonance imaging system employing a small, high-field polarizing magnet (e.g. a 15T magnet) to polarize a frozen material which is then warmed up and administered to a subject placed within the imaging apparatus. The material used may be water, saline, a fluorocarbon or a noble gas such as He or Xe. Since the magnetic field in the polarizing magnet is greater than that inside the imaging apparatus and since polarization is effected at low temperature, an increased population difference between the nuclear spin states (i.e. polarization) should result in a stronger MR signal from the polarized material.

In U.S. Pat. No. 5,611,340 (Souza), a somewhat similar MR imaging system is disclosed. Here however liquid hydrogen is polarized by the polarizing magnet and thereafter it is heated up and reacted with oxygen to produce polarized water which is administered to the subject. The resulting enhanced MR signal will be an enhanced $^1H$ MR signal.

U.S. Pat. No. 5,545,396 (Albert) discloses an in vivo MR imaging method in which a noble gas (e.g. $^{129}Xe$ or $^3He$) having a hyperpolarised nuclear spin is inhaled into the lungs and a representation of its spatial distribution therein is generated. MR imaging of the human oral cavity using hyperpolarised $^{129}Xe$ was also reported by Albert in J. Mag. Res., 1996: Bill, 204–207.

The use of hyperpolarised MR contrast agents in MR investigations such as MR imaging has the advantage over conventional MR techniques in that the nuclear polarisation to which the MR signal strength is proportional is essentially independent of the magnetic field strength in the MR apparatus. Currently the highest obtainable field strengths in MR imaging apparatus are about 8T, while clinical MR imaging apparatus are available with field strengths of about 0.2 to 1.5T. Since superconducting magnets and complex magnet construction are required for large cavity high field strength magnets, these are expensive. Using a hyperpolarised contrast agent, since the field strength is less critical, it is possible to make images at all field strengths from earth's field (40–50 $\mu T$) up to the highest achievable fields. However there are no particular advantages to using the very high field strengths where noise from the patient begins to dominate over electronic noise (generally at field strengths where the resonance frequency of the imaging nucleus is 1 to 20 MHz) and accordingly the use of hyperpolarised contrast agents opens the possibility of high performance imaging using low cost, low field strength magnets.

The present invention is based on a method of MRI of a sample which relies on ex vivo nuclear polarisation of selected I≠0 imaging nuclei (e.g. $^{13}C$, $^{15}N$ and $^{29}Si$ nuclei) of an MR imaging agent by reaction of a precursor to said agent with ortho-deuterium enriched hydrogen (i.e. $^1H_2$ or $^2H_2$ gas or mixture thereof) gas.

Thus viewed from one aspect the present invention provides a method of magnetic resonance investigation of a sample, preferably a human or non-human animal body (e.g. a mammalian, reptilian or avian body), said method comprising:

(i) reacting ortho-deuterium enriched hydrogen with a hydrogenatable MR imaging agent precursor, preferably a compound containing a hydrogenatable unsaturated bond and preferably a compound containing a non-zero nuclear spin nucleus, preferably a non-zero nuclear spin nucleus other than $^1H$, more preferably a spin ½ (I=½) nucleus, to produce a hydrogenated (i.e. deuterated) MR imaging agent;

(ii) optionally, subjecting said hydrogenated MR imaging agent to a low magnetic field, e.g. a field of less than 50 $\mu T$, preferably less than 5 $\mu T$, more preferably less than 1 $\mu T$;

(iii) administering said hydrogenated MR imaging agent to said sample;

(iv) exposing said sample to radiation of a frequency selected to excite nuclear spin transitions of selected non-zero nuclear spin nuclei in said hydrogenated MR imaging agent;

(v) detecting magnetic resonance signals of said selected non-zero nuclear spin nuclei from said sample; and (vi) optionally, generating an image or biological functional data or dynamic flow data from said detected signals.

The MR signals obtained in the method of the invention may be conveniently converted into 2- or 3-dimensional image data or into functional, flow or perfusion data by conventional manipulations.

The term "hydrogen" as used herein refers to atoms and molecules of $^1H$ and other hydrogen isotopes, e.g. $^2H$ (i.e. deuterium). "Hydrogenation" refers to reaction with a hydrogen molecule, e.g. with $^1H_2$ or $^2H_2$ or mixtures thereof, optionally together with other gases, generally gases not participating in the hydrogenation reaction.

$^1H_2$ hydrogen molecules exist in two different nuclear spin isomer forms, namely para-hydrogen (p-$H_2$) where the nuclear spins are antiparallel and out of phase (the singlet state) and ortho hydrogen (o-$H_2$) where they are parallel or antiparallel and in phase (the triplet state). At room temperature, the two forms exist in equilibrium with a 1:3 ratio of para:ortho hydrogen. At 80K the ratio is 48:52 and at 20K it approaches 100:0, i.e. 99.8:0.2. Reducing the temperature still further is not beneficial since hydrogen freezes at about 17K. The deuterium molecule, $^2H_2$ or $D_2$, also exists, in two nuclear spin isomer forms;

ortho- and para-deuterium (herein o-$D_2$ and p-$D_2$). However, because the deuteron is an integral spin particle (I=1) i.e. a boson, and the proton a half-integer spin particle (I=½) i.e. a fermion, the two isotopic forms possess different symmetry properties.

The total wave function of a homonuclear diatomic molecule can be written as $$\psi_{total} = \psi_{trans} \psi_{rot} \psi_{vib} \psi_{elec} \psi_{nuc}$$

where the indices denote contributions from translational, rotational, vibrational, electronic and nuclear wavefunctions respectively. For fermions the total wavefunction must be anti-symmetric under interchange of the two identical nuclei, but for bosons the total wavefunction must be symmetric. For both isotopic forms of hydrogen ($^1H_2$ and $^2H_2$) the wavefunctions $\psi_{trans} \psi_{rot} \psi_{elec}$ are unaffected by the inversion operation. The overall symmetry is thus determined by the product $\psi_{rot} \psi_{nuc}$. For the $D_2$ molecule we have nine nuclear wavefunctions, three antisymmetric and six symmetric. If one denotes the three spin states of a single deuteron by /->, /0> and /+>, and use the conventional notation /ij>≡/i>⊗/j>, one obtains the following nuclear spin states for the $D_2$ molecule:

Antisymmetric states (para)

$\psi_1^p = 1/\sqrt{2}(|-0> - |0->)$, $\psi_2^p = 1/\sqrt{2}(|-+> - |+->)$, $\psi_3^p = 1/\sqrt{2}(|0+> - |+0>)$, Symmetric states (ortho)

$\psi_1^o = |-->$, $\psi_2^o = |00>$, $\psi_3^o = |++>$, $\psi_4^o = 1/\sqrt{2}(|-0> + |0->)$, $\psi_5^o = 1/\sqrt{2}(|-+> + |+->)$, $\psi_6^o = 1/\sqrt{2}(|0+> + |+0>)$, The eigenstates $\psi_{rot}^J$ of the rotational Hamiltonian, with (energy) eigenvalues $\epsilon_J = hJ(J+1)/(2I)$, are symmetric for even values of the rotational quantum number J and anti-symmetric for odd values of J. To obtain the overall symmetric wavefunction for the $D_2$ molecule one must couple the anti-symmetric nuclear spin function with odd values of J and the symmetric nuclear spin functions with even values of J. The total combined partition function is given by $$q_{rot,nuc}(T) = 6 \sum_{J \text{ even}} (2J+1)e^{-\Theta_r J(J+1)/T} + 3 \sum_{J \text{ odd}} (2J+1)e^{-\Theta_r J(J+1)/T}$$

where $\Theta_r$ is the so-called characteristic temperature of rotation ($\Theta_r \approx 42.7$ K for $D_2$) and T is temperature in Kelvin.

The fraction of ortho-$D_2$ in an equilibrium mixture of ortho-/para-$D_2$ is $$f_o \equiv \frac{N_{ortho}}{N_{ortho} + N_{para}} =$$

$$\frac{6 \sum_{J \text{ even}} (2J+1)e^{-\Theta_r J(J+1)/T}}{6 \sum_{J \text{ even}} (2J+1)e^{-\Theta_r J(J+1)/T} + 3 \sum_{J \text{ odd}} (2J+1)e^{-\Theta_r J(J+1)/T}}$$

In the high temperature limit (T→∞) this fraction is equal to ⅔, but for T=0 it is 1. The temperature dependence of $f_o$ is plotted in FIG. 1 of the accompanying drawings.

At ambient temperature $f_o$ is about 0.67, at 77K it is about 0.70 and at 20K it is about 0.98. Reducing the temperature still further is not especially helpful since $D_2$ freezes at about 19K.

The rate of equilibration between nuclear spin state isomers is very low in pure hydrogen but in the presence of any of several known catalysts (such as $Fe_3O_4$, $Fe_2O_3$, or activated charcoal) an equilibrium mixture is rapidly obtained and remains stable at room temperature for several hours after separation from the catalyst.

Thus by "enriched hydrogen" above is meant hydrogen in which there is a higher than equilibrium proportion of ortho-deuterium and/or para-hydrogen; for example where the proportion of ortho (relative to the total of $D_2$) is more than 67%, preferably more than 70%, more preferably 75% or more, still more preferably 80% or more, particularly preferably 90% or more, especially preferably 97% or more.

Typically in the preparation of enriched hydrogen, an optional initial step in the method according to the invention, will be carried out catalytically at low temperatures e.g. at 160K or less, preferably at 80K or less or more preferably at about 20K.

The enriched hydrogen thus formed may be stored for long periods, preferably at low temperature, e.g. 20–25K. Alternatively it may be stored in pressurized gas form in containers with non-magnetic and non-paramagnetic inner surfaces, e.g. a gold or deuterated polymer coated container, or one of low paramagnetic glass as described in WO99/17304 for storage of hyperpolarised $^3$He.

Generally speaking, if a o-$D_2$ or p-$H_2$ molecule is transferred to a host molecule by means of catalytic hydrogenation (optionally at elevated pressure (e.g. 50 to 100 bar)), the deuteron or proton spins remain correlated and begin to relax to thermal equilibrium with the normal time constant $T_1$ of the hydrogen in the molecule (typically about one second). However during relaxation some of the polarisation may be transferred to neighbouring nuclei by cross-relaxation or other types of coupling. The presence of, for example, a $^{13}$C nucleus with a suitable substitution pattern close to the relaxing hydrogen may lead to the polarisation being conveniently trapped in the slowly relaxing $^{13}$C nucleus. A $^{13}$C nucleus in a carbonyl group or in certain quaternary carbons may have a $T_1$ relaxation time typically of more than a minute.

The transfer of the polarization may be promoted by exposing the hydrogenated host molecule to a low magnetic field, i.e. a field lower than earth's ambient field, more particularly a microTesla field, e.g. ≤50 μT, preferably ≤1 μT, more preferably ≤0.6 μT.

Where the MR imaging performed is to be $^2$H-MR imaging however, the low magnetic field treatment is not required and the imaging nuclei, the nuclei responsible for the MR signals from which the MR image is constructed, will primarily be the $^2$H nuclei introduced by the hydrogenation reaction. In this event however the hydrogenated host molecule is preferably non-symmetric, particularly preferably non-symmetric within 4 to 5 bonds of the hydrogenated bond (e.g. $H_5C_2OOCCH=CHCH_3$ would on hydrogenation be unsymmetric within 2 bonds of the hydrogenated ethylenic C:C bond).

The present invention is primarily concerned with $o$-$D_2$ hydrogenation. The equivalent p-$H_2$ hydrogenation is the subject of PCT/GB98/03399, published May 20, 1999 as WO99/24080, the contents of which are incorporated herein by reference. The hydrogen used in the process of the invention may be pure $D_2$; however $D_2$ enriched hydrogen, i.e. where the $^2H_2$:$^1H_2$ ratio is greater than normal isotopic abundance, may be used and the MR imaging may be of the p-$^1H_2$ induced transferred polarization, the o-$^2H_2$ induced transferred polarization or the o-$^2H_2$ introduced polarization. Where $D_2$ enriched $^1H_2$ is used, the $D_2$:$^1H_2$ ratio is conveniently at least 2:98, e.g. at least 10:90, preferably at least 90:10. The hydrogen gas used for hydrogenation may contain other gases; these however are preferably non-paramagnetic (e.g. gases other than oxygen) and non-competing in the hydrogenation reaction. Thus for example noble gases or nitrogen may be present.

The hydrogenation step should preferably be performed in the liquid or gaseous phase, preferably in the absence of materials which would promote relaxation. If in the liquid phase, then the catalyst can be removed by filtration through, for example, an ion-exchange resin. If in the gas phase, then separation of a solid catalyst is trivial and the MR imaging agent formed can simply be passed into a suitable solvent, preferably a physiologically tolerable solvent, most preferably water, and used according to the invention.

Thus the present invention is based on the recognition that polarisation of certain nuclei (e.g. $^{13}C$, $^{15}N$, $^1H$, $^2H$, etc. nuclei) in a host molecule using enriched hydrogen represents a means for performing ex vivo polarisation of an MR imaging agent prior to its administration into a subject and conventional MR imaging. The term "MR imaging agent" used herein refers to an agent containing nuclei (MR imaging nuclei) capable of emitting magnetic resonance signals. Such MR imaging nuclei are non-zero nuclear spin nuclei capable of emitting magnetic resonance signals, preferably I=½ nuclei such as e.g. $^{19}F$, $^3Li$, $^1H$, 2H, $^{13}C$, $^{15}N$, $^{29}Si$ or $^{31}P$ nuclei, but preferably are $^{13}C$, $^{15}N$, $^1H$ or $^2H$ nuclei, most preferably $^{13}C$ nuclei. The MR imaging agent precursor however preferably contains a I=½ nucleus.

The non-zero nuclear spin nucleus in the MR imaging agent may be present in its naturally occurring isotopic abundance. However where the nucleus is a non-preponderant isotope (e.g. $^{13}C$ where $^{12}C$ is the preponderant isotope) it will generally be preferred that the agent's content of that nucleus be enriched, i.e. that it is present at a higher than normal level.

Viewed from a further aspect the present invention provides the use of ortho-deuterium enriched hydrogen (i.e. o-$D_2$ enriched $D_2$ or $D_2$/$^1H_2$ mixtures) in MR imaging of a sample (e.g. a human body), preferably $^{13}C$, $^{15}N$ or $^1H$ MR imaging of a sample.

Viewed from an alternative aspect, the invention provides the use of ortho-deuterium enriched hydrogen for the manufacture of an MR imaging agent for use in a method of diagnosis involving generation of an MR image by MR imaging of a human or non-human animal body.

Viewed from a still further aspect the invention provides use of a hydrogenatable compound in the manufacture of an MR imaging agent for use in a method of diagnosis involving generation of an MR image by MR imaging, said manufacture involving hydrogenation of said compound with ortho-deuterium enriched hydrogen.

The para-$^1H_2$ enriched hydrogen used in the method of WO99/24080 will inevitably have a higher than 2:1 ratio of o-$D_2$/p-$D_2$ in any trace $D_2$ also present. Thus the term "ortho-deuterium enriched hydrogen" as used herein means that the $D_2$:$^1H_2$ ratio is greater than natural abundance, e.g. greater than 5:95, preferably greater than 1:9, more preferably greater than 9:1, and that the o-$D_2$:p-$D_2$ ratio is greater than the equilibrium ratio at ambient temperature, e.g. greater than 2:1, preferably greater than 7:10 more preferably greater than 8:10 etc.

By imaging, it will be appreciated that not just production of two or three dimensional morphological images is covered: the images produced may be representations of the value or temporal change in value of a physiological parameter such as temperature, pH, oxygen tension, etc. Morphological images however will generally be produced.

A molecule hydrogenated (pairwise) with ortho-deuterium will achieve a non-Boltzmann distribution of the deuteron energy levels, thus enabling a signal enhancement compared with the thermal equilibrium system.

Considering the effect hydrogenation with ortho-deuterium has on the NMR spectrum of deuterium, limiting ourselves to look at the isolated two-spin system of deuterium in the hydrogenated molecule allows us to observe the essential features of this sytem. Additional coupling to other nuclei will of course affect the NMR signal but as in the case for para-hydrogen the main behaviour of the system can be described.

The initial spin density operator of the $D_2$ system is given by $$\sigma D_2 = f_o \sigma_c + (1-f_o)\sigma_p$$

where $\sigma_o$ and $\sigma_p$ are the spin density operators of ortho-and para-deuterium respectively, being equal to $$\sigma_p = \frac{1}{3}|\psi_1^p\rangle\langle\psi_1^p| + \frac{1}{3}|\psi_2^p\rangle\langle\psi_2^p| + \frac{1}{3}|\psi_3^p\rangle\langle\psi_3^p|$$

$$\sigma_o = \frac{1}{6}|\psi_1^o\rangle$$

$$\langle\psi_1^o| + \frac{1}{6}$$

$$|\psi_2^o\rangle\langle\psi_2^o|$$

$$+\frac{1}{6}|\psi_3^o\rangle$$

$$\langle\psi_3^o| + \frac{1}{6}|$$

$$|\psi_4^o\rangle\langle\psi_4^o|$$

$$+\frac{1}{6}|\psi_5^o\rangle$$

$$\langle\psi_5^o| + \frac{1}{6}|$$

$$|\psi_6^o\rangle\langle\psi_6^o|$$

The theoretical treatment of the $D_2$ spin system is analogous to the treatment of the $H_2$ spin system. The spin matrices will of course be of higher deminsionality and thus differ from the spin matrices of the $H_2$ spin system. In the subsequent discussion, it is assumed that the hydrogen introduced by hydrogenation is 100% ortho-deuterium. The effect of using $D_2$ having a lesser amount of ortho-deuterium is to scale the signal by a factor equal to $f_o - \frac{2}{3}$. At a temperature of 77K the fraction of ortho-deuterium is equal to 70.26%, and at 20K it is equal to 97.95%. Using ortho-$D_2$ obtained at 77K gives a signal that is about a factor of 9 smaller than using 100% ortho-$D_2$.

The deuterium spectrum of a two-spin system at thermal equilibrium consists in the weak coupling case of two triplets centred at the Larmor frequencies of the two nuclei.

In the case of strong coupling the spectrum will be much more complicated, with a large number of peaks not present in the simple first-order spectrum. A realistic system will however be weakly coupled because of the isotopic effect. Substituting a proton with a deuteron will reduce the J-coupling to a second proton by a factor very close to $Y_D/Y_H$. If two J-coupled protons are substituted by deuterons their J-coupling should decrease by a factor $(Y_D/Y_H)^2 \approx 0.024$. A typical value for the J-coupling between two protons separated by three bonds (H—C=C—H) is 15 Hz, which then would reduce to 0.35 Hz in the deuterated system. In the following only the weakly coupled system will be considered if not otherwise stated.

The density operator calculation of this system reveals a different behavour, both quantitatively and qualitatively, depending on whether hydrogenation takes place in a low or a high field before it is inserted into the magnet. The passage from low to high field behaviour occurs at a field where the chemical shift difference between the deuterons becomes comparable to their mutal J-coupling, i.e. $2\pi J \sim \delta Y_D B_0$. (These two cases have historically been denoted by the acronyms ALTADENA and PASADENA for the low- and high-field exposures respectively). Using the (reasonable) parameters J=0.35 Hz and δ=1 ppm, we obtain the low field behaviour when $B_0 \ll 54$ mT.

In the high field case, the flip-angle dependency of the ortho-deuteritim system is similar to that of its protonated (para-hydrogen) counterpart. Maximum signal intensity is observed for flip-angles equal to 45° C. and 135°. The outer peaks in each triplet dominate the spectrum and are, except for flip-angles close to 90°, in anti-phase. The central peak of each triplet is comparably weaker. For very small J-couplings (compared with the linewidth) the two anti-phase peaks overlap thus reducing the observed signal. When applying a flip-angle of 90°, the central peak of each triplet will be negligible. The two remaining peaks within each triplet are in phase, but the two triplets separated by the chemical shift difference between the protons are in anti-phase (see FIGS. 2a and 2b of the accompanying drawings). The maximum signal enhancement, with respect to the thermal equilibrium signal, is of the order $\approx 3 \cdot 10^4$.

Figure 3B:
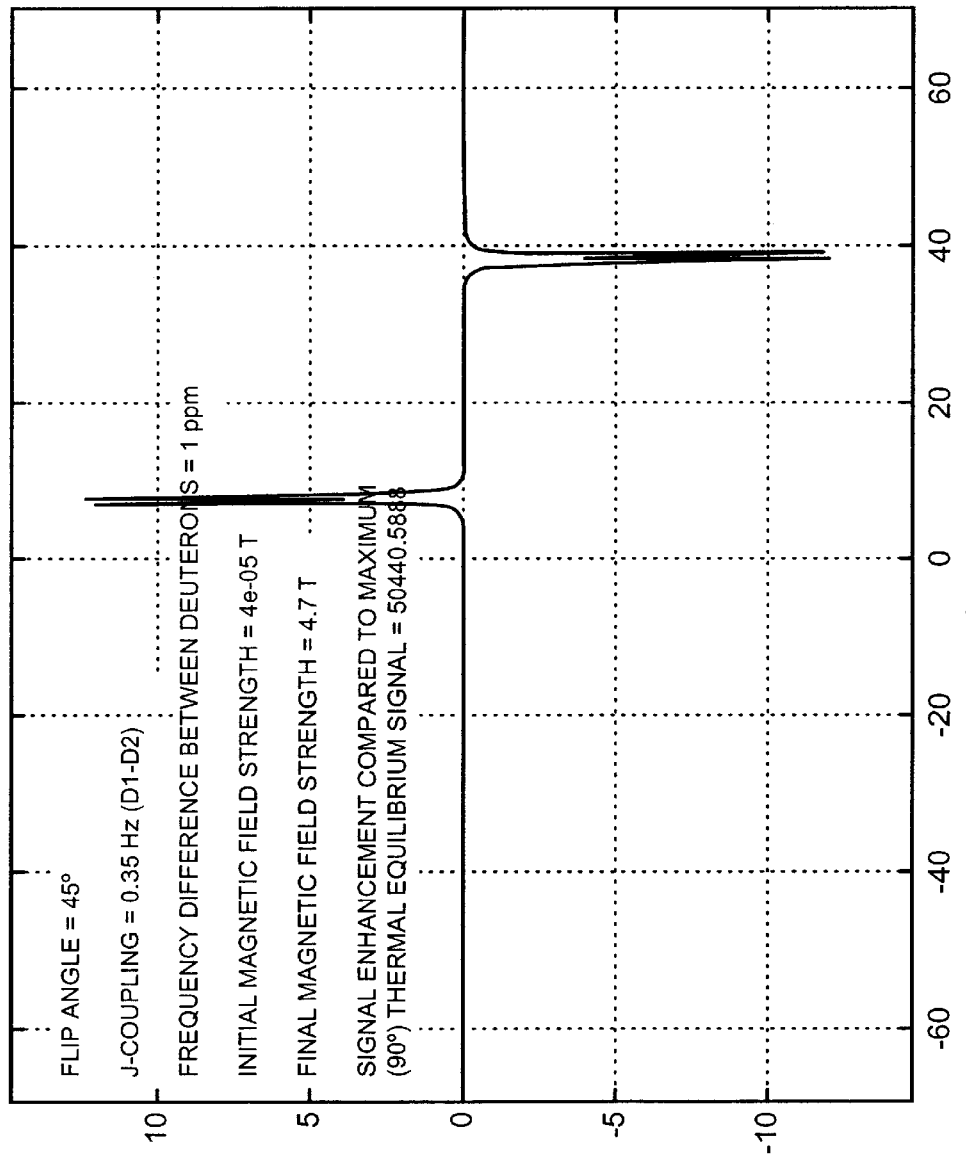

For the system o-$D_2$ hydrogenated at low field, maximum signal is obtained for a flip-angle equal to 90°, analogous to the para-hydrogen system at low field. For low flip-angles the central peak of each triplet dominates the spectrum, but for a flip-angle equal to 90° each triplet consists of the two outer peaks as in the high-field case (see FIGS. 3a and 3b of the accompanying drawings). When the linewidth is larger than the J-coupling, the spectrum will effectively consist of two anti-phase peaks just as in the para-hydrogenated spectrum. The maximum enhancement is of the order $\approx 5 \cdot 10^4$.

Compared to the proton signal of a para-hydrogenated molecule, the deuterium signal of a ortho-deuterated molecule will be weaker. The enhancement factor for the protonated system is of the same order as for the deuterated system, but the gyromagnetic ratio is a factor 6.5 smaller for deuterium than for protons.

A common feature for the $^1H$ and $^2H$ signals of the (former) para-hydrogen and ortho-deuterium nuclei respectively is that it is not possible to obtain a net signal by low-field treatment. However, it is possible to obtain a net-signal for a third non-zero nuclear spin nucleus, J-coupled to the hydrogens introduced by hydrogenation, i.e. the ortho-deuterium deuterons or the para-hydrogen protons.

MR imaging agent precursors suitable for use in the present invention are hydrogenatable and will typically possess one or more unsaturated bonds, e.g. double or triple carbon-carbon bonds. For in vivo imaging, the hydrogenated MR imaging agent should of course be physiologically tolerable or be capable of being presented in a physiologically tolerable form.

The MR imaging agent should preferably be strongly polarisable (for example, to a level of greater than 5%, preferably greater than 10%, more preferably greater than 25%) and have a I=½ MR imaging nucleus with a long $T_1$ relaxation time under physiological conditions, e.g. $^1H$, $^{13}C$, $^{15}N$ or $^{29}Si$, particularly $^{13}C$ or $^{15}N$. By a long $T_1$ relaxation time is meant that $T_1$ is such that once polarised, the MR imaging agent will remain so for a period sufficiently long to allow the imaging procedure to be carried out in a comfortable time span. Significant polarisation should therefore be retained for at least 1 s, preferably for at least 30 s, more preferably for at least 60 s, especially preferably 100 s, and more especially 500 s or longer.

There will preferably be nuclear spin:spin coupling in the imaging agent between the MR imaging nucleus and at least one of the hydrogens introduced as a result of hydrogenation. The coupling constant is preferably between 0.1 and 300 Hz, more preferably between 1 and 10 Hz. This is preferably achieved by placing the MR imaging nucleus no more than 3, more preferably no more than 2 bonds away from the ortho-deuterium derived deuterium. Desirably the nmr signal from the MR imaging nucleus (hereinafter occasionally referred to as the reporter nucleus), is sharp, preferably with a linewidth (at 37° C. in blood or tissue) of less than 100 Hz, more preferably less than 10 Hz, even more preferably less than 1 Hz. Accordingly, the MR imaging agent will preferably contain as few non-zero nuclear spin atoms (besides the reporter nucleus and the two hydrogens introduced by the hydrogenation) as possible which can couple with the reporter nucleus. Desirably therefore the MR imaging agent contains no more than 10, more preferably no more than 5, still more preferably no more than 2, even more preferably no more than 1, and especially preferably no non-zero nuclear spin nuclei within 3 bonds of the reporter nucleus, and still more preferably within 4 bonds. Most preferably the only non-zero nuclear spin nuclei in the MR imaging agent are the reporter nucleus and the hydrogens introduced by the hydrogenation. Quadrupolar nuclei (e.g. $^{14}N$, $^{35}Cl$ and $^{79}Br$) should preferably not be included in the MR imaging agent although they may be present in counterions or other dissolved components of a contrast medium containing the MR imaging agent. Where the reporter nucleus is an I=½ nucleus other than $^1H$, avoidance of undesired nuclei may involve use of deuterium in place of protons in the MR imaging agent. Thus where the unsaturated bond to be hydrogenated is a C=C bond, this may desirably be in a —CD=CD— structure. In this way the polarization transfer to the reporter nucleus, e.g. $^{13}C$ in a —$^{13}C$—C=C— structure may be increased. The MR imaging agent should preferably be relatively small (e.g. molecular weight less than 500D, more preferably less than 300D (e.g. 50–300D) and more preferably 100 to 200D) and also preferably should be soluble in a liquid solvent or solvent mixture, most preferably in water or another physiologically tolerable solvent or solvent mixture. The MR imaging agent precursor likewise is preferably soluble in such solvents or solvent mixtures and desirably is capable of undergoing rapid catalysed hydrogenation, e.g. at a conversion rate of at least 1 g precursor/min using 2 mole % or less of catalyst. Furthermore, the chemical shift, or even better the coupling constant of the nmr signal from the imaging nucleus in the MR imaging agent should preferably be influenced by physiological parameters (e.g. morphology, pH, metabolism, temperature, oxygen tension, calcium concentration, etc). For example, influence by pH can be used as a general disease marker, whilst influence by metabolism may be a cancer marker. Alternatively, the MR imaging agent may conveniently be a material which is transformed (e.g. at a rate such that its half-life is no more than $10 \times T_1$ of the reporter nucleus, preferably no more than $1 \times T_1$) in the subject under study to a material in which the reporter nucleus has a different coupling constant or chemical shift. In this case the subject may be inanimate or animate, e.g. a human or animal, a cell culture, a membrane-free culture, a chemical reaction medium, etc. Thus for example the reporter nucleus may provide information on the operation of the biochemical machinery of an organism where that machinery transforms the MR imaging agent and in so doing changes the chemical shift or coupling constant of the reporter nucleus. It will be appreciated that the imaging process used in this case may be an nmr spectroscopic procedure rather than (or in addition to) an imaging procedure which generates a morphological image.

The MR imaging agent should preferably be $^{13}C$ or $^{15}N$ enriched, particularly preferably $^{13}C$ enriched, in positions close to the hydrogenation site, e.g. a double or triple bond, and where relaxation is slow. Preferred MR imaging agents according to the invention also exhibit the property of low toxicity.

Generally speaking, to increase the MR signal from the hydrogenated MR imaging agent, it may be desirable to incorporate more than one unsaturated bond in each molecule of the precursor, e.g. in a conjugated unsaturated system. However due consideration must be given to the need to keep molecular weight relatively low to prevent difficulties in administration of the agent. The presence of one or more C≡C bonds in the hydrogenatable MR imaging agent precursor increases the reaction rate and may therefore be preferred. Also preferred are compounds with an unsaturated carbon-carbon bond with one or more carbonyl substituents, e.g. an αβ unsaturated carbonyl compound. Particularly preferred are compounds comprising disubstituted unsymmetric alkylene or acetylene groups with a carbonyl-unsaturation-carbonyl moiety. Such compounds are of high reactivity and may allow two or more $^{13}C$ atoms to be incorporated to utilize the polarisation more efficiently.

Precursors that match as many of the above design parameters as possible form excellent MR imaging agents once reacted with ortho-deuterium. Such agents have both in vitro and in vivo usage.

The use of deuterated MR imaging agents and the deuteration of their precursors which are reporter nucleus enriched, i.e. have greater than natural isotopic abundance of the reporter nucleus, are novel and form further aspects of the invention. Viewed from a first of these aspects the invention provides the use of a precursor compound:

(i) containing a hydrogenatable unsaturated bond;
(ii) containing a non-zero nuclear spin nucleus having high (e.g. >50%) natural abundance or at greater than natural isotopic abundance;
(iii) having a molecular weight preferably below 100D, more preferably below 500D; and
(iv) which following hydrogenation with o-$D_2$ has an nmr spectrum for said non-zero nuclear spin nucleus which is a multiplet having a coupling constant relative to one of the deuteriums introduced by hydrogenation of 0.1 to 300 Hz and having a linewidth of less than 100 Hz, preferably below 10 Hz, more preferably below 1 Hz for the manufacture of an MR imaging agent by a process involving hydrogenation of said precursor compound with o-$D_2$, optionally for use of said imaging agent in a method of diagnosis involving MR imaging.

The hydrogenatable precursor compound preferably contains as said non-zero nuclear spin nucleus a I=½ nucleus such as $^1H$, $^{13}C$, $^{15}N$ or $^{29}Si$, especially $^{13}C$. Preferably it also has some or all of the desired properties discussed earlier, e.g. solubility, paucity of other I≠0 nuclei (although these may be present in a counterion component of the compound if it is ionic), reactivity to o-$D_2$ hydrogenation, etc.

Viewed from a further aspect the invention also provides a reporter compound:

(i) containing at least two deuterons;
(ii) containing a non-zero nuclear spin nucleus having high (e.g. >50%) natural abundance or at greater than natural isotopic abundance;
(iii) having a molecular weight preferably below 1000D, more preferably below 500D; and
(iv) having an nmr spectrum for said non-zero nuclear spin nucleus which is a multiplet having a coupling constant relative to one of said at least two deuterons of 0.1 to 300 Hz and having a linewidth of less than 100 Hz, preferably below 10 Hz, more preferably below 1 Hz.

Once again, the reporter compounds of the invention, which are obtainable by o-$D_2$ hydrogenation of the precursor compounds will desirably possess some or all of the desired properties referred to earlier, e.g. solubility, narrow linewidths, coupling constants in the 10 to 100 Hz range, coupling constant sensitivity, chemical shift sensitivity, isotopic make up, etc.

Preferred precursor compounds for MR imaging agents for use according to the invention desirably contain the following molecular sub-units:

(i) at least one C=C or C≡C bond;
(ii) a C, N or Si atom separated by one or two bonds from a C=C or C≡C bond, bound only to atoms the naturally most abundant isotope form of which has a nuclear spin I=0, and not coupled by a series of covalent bonds to any atoms the naturally most abundant isotopic form of which has I>½; and
(iii) at least one water-solubilizing moiety, i.e. a functional group which imparts water solubility to the molecule, e.g. hydroxyl, amine or oxyacid (e.g. carboxyl) groups.

Correspondingly, preferred MR imaging agents for use according to the invention desirably contain the following molecular sub-units:

(i) at least one CD—CD or CD=CD moiety;
(ii) a $^1H$, C, N or Si atom separated by zero, one or two bonds from a CD—CD or CD=CD moiety, bound only to atoms the naturally most abundant isotopic form of which has I=0, and not coupled by a series of covalent bonds to any atoms (other than D atoms introduced by o-$D_2$ deuteration) the naturally most abundant isotopic form of which has I>½; and
(iii) at least one water-solubilizing moiety, i.e. a functional group which imparts water solubility to the molecule, e.g. hydroxyl, amine or oxyacid (e.g. carboxyl) groups.

While compounds meeting these criteria can be used according to the invention without enrichment in $^{13}C$, $^{15}N$ or $^{29}Si$, it is preferred that where $^{13}C$, $^{15}N$ or $^{29}Si$ is the reporter nucleus they be enriched and in particular that there be such isotopic enrichment of the reporter nucleus atoms.

Specifically preferred hydrogenatable MR imaging agent precursors for use in the method of the invention include simple unsaturated acids (e.g. acrylic acid, crotonic acid, propionic acid, fumaric acid, maleic acid and HOOC.C≡C.COOH), especially where a carboxyl carbon separated by two or more favourably one bond from the unsaturated bond is $^{13}C$ or $^{13}C$ enriched,

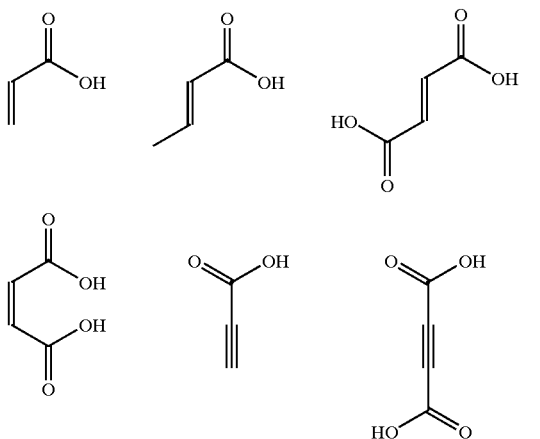

unsaturated quaternary carbon compounds where the quaternary carbon is separated by two or more preferably one bond from the unsaturated bond and preferably where the quaternary carbon is $^{13}C$ or $^{13}C$ enriched, e.g.

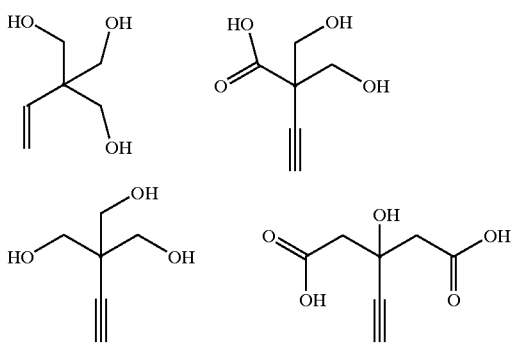

compounds with more than one hydrogenation site such as

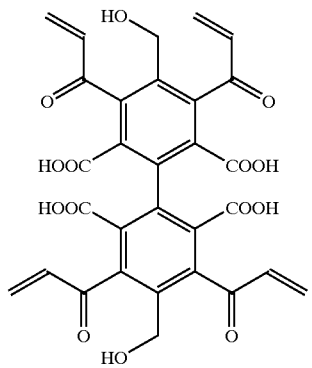

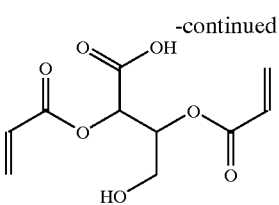

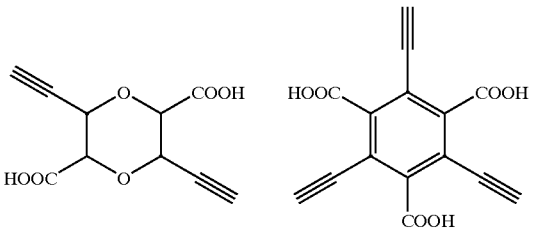

especially where a carbon separated by two or more preferably one bond from an unsaturated bond is $^{13}C$ or $^{13}C$ enriched and other compounds such as:

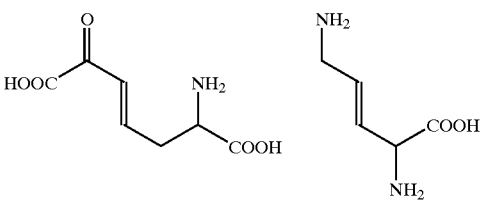

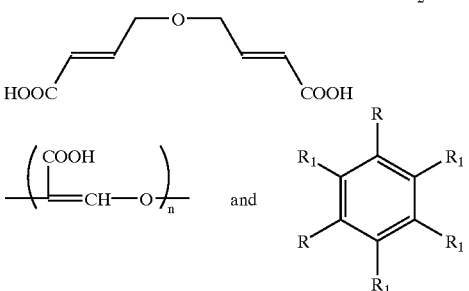

(where $R_1$ is

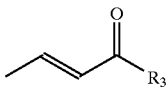

$R_3$ is alkyl, hydroxyalkyl, amino, hydroxyl etc, R is $CONHR_2$ and $R_2$ is a conventional hydrophilic group known to be useful in X-ray contrast media such as a straight chain or branched $C_{1-10}$-alkyl group, preferably a $C_{1-5}$ group, optionally with one or more $CH_2$ or CH moieties replaced by oxygen or nitrogen atoms and optionally substituted by one or more groups selected from oxo, hydroxy, amino, carboxyl derivative, and oxo substituted sulphur and phosphorus atoms).

$^{13}C$ enriched MR imaging agents have $^{13}C$ at one particular position (or more than one particular position) in an amount in excess of the natural abundance, i.e above about it. Preferably such a single carbon position will have 5% or more $^{13}C$, particularly preferably 10% or more, especially preferably 25% or more, more especially preferably 50% or more, even more preferably in excess of 99% (eg 99.9%).

In all these hydrogenatable compounds represented by formulae herein, protons (H) may optionally be replaced by deuterons, except perhaps protons which are labile on dissolution (e.g. carboxyl protons).

In addition, compounds which on hydrogenation yield compounds which are or are analogous to naturally occurring biomolecules (e.g. amino acids, metabolites, neurotransmitters, receptor binding molecules, nucleic acids, etc) are possible MR imaging agent precursors for use in the method of the invention.

For studies of biochemical reactions, it may also be interesting to use succinic acid (which occurs in the citric acid cycle), especially $^{13}C$ enriched succinic acid:

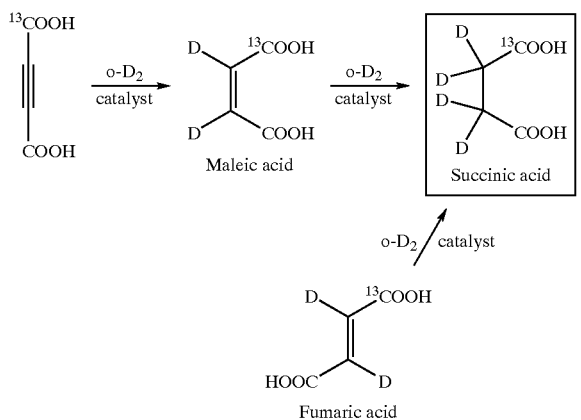

For studies of peptide/protein synthesis, whether natural or artificial, it may likewise be interesting to use amino acids, produced by o-$D_2$ hydrogenation of a β carbon-γ carbon unsaturated bond, especially where the carboxyl carbon is $^{13}C$ enriched.

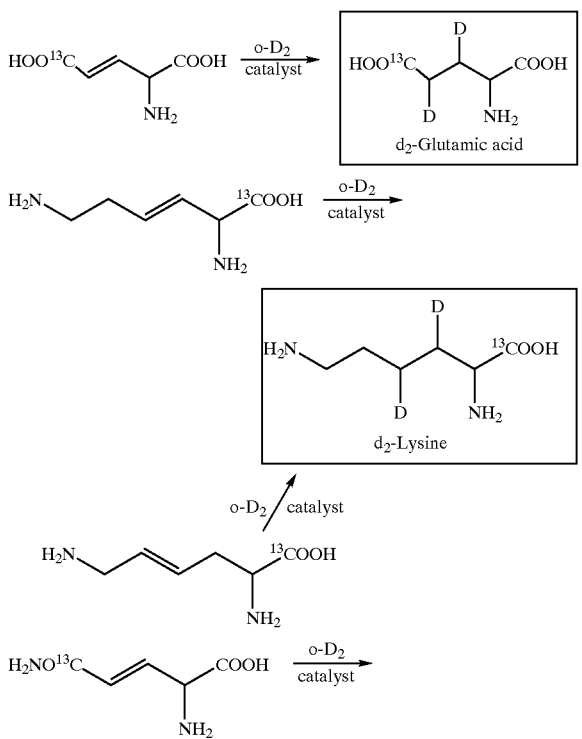

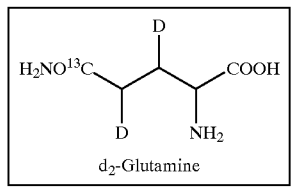

Amides, amines, cyanides and nitroxides or other nitrogen containing MR imaging agents are particularly suitable for i$^{15}N$ reporter nuclei as are compounds which comprise a ring nitrogen containing heterocycle. One example of a $^{15}N$ reporter nucleus imaging agent is acetyl choline, which is biologically modified and so may be used to study metabolic processes. This imaging agent may be produced by o-$D_2$ hydrogenation of corresponding ethylenically or acetylenically unsaturated precursors, preferably ones enriched in $^{15}N$:

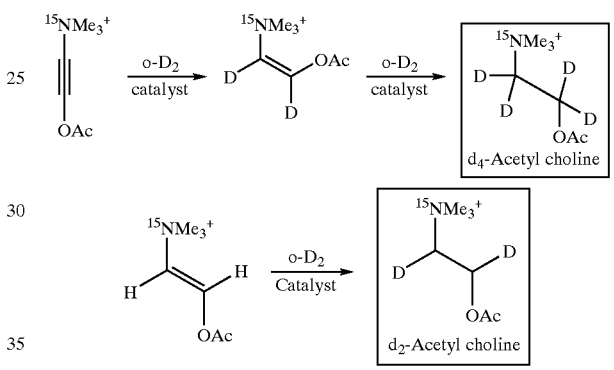

Likewise amino acids, or deuterated versions thereof, may be used as vehicles for $^{15}N$. Silane and silicone compounds may similarly be used as vehicles for $^{29}Si$.

Due to their biotolerability, compounds with quaternary carbons may be preferred. Cationic compounds may also be used, e.g. quaternary ammonium salts.

One especially preferred hydrogenatable or hydrogenated MR imaging agent is maleic acid dimethyl ester which is the hydrogenation product of acetylene dicarboxylic acid dimethyl ester.

Another useful MR imaging agent would be methionine, and thus an unsaturated methionine precursor may advantageously be used as the precursor compound.

Other interesting precursors include acetylenic compounds such as the following

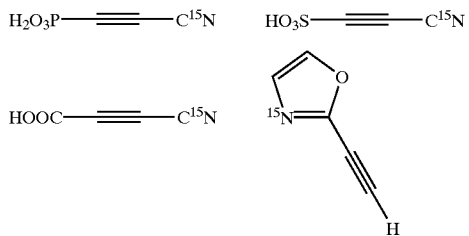

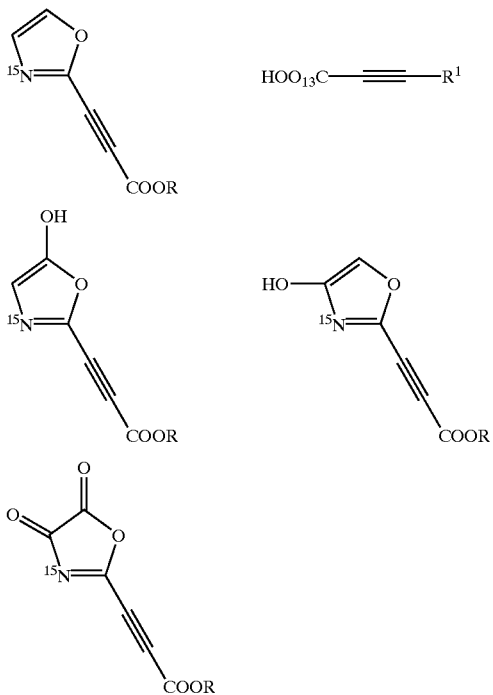

where R is H or $C_{1-6}$ alkyl and $R^1$ is hydroxylalkyl, or a sulphone or sulphoxide.

Compounds of the types listed above but without non-hydrogen I=½ nuclei may also be used to advantage for $^1$H or $^2$H MR imaging.

Typically the hydrogenatable MR imaging agent precursor will undergo o-$D_2$ hydrogenation in the presence of a suitable catalyst, optionally at elevated temperature or pressure. The hydrogenation catalyst used in the method of the invention need not be a homogeneous catalyst but during hydrogenation the entire Do molecule should be transferred to the host molecule. Some examples of catalysts that are able to fulfil this criterion are shown in Table 1.

TABLE 1

Hydrogenation catalysts that transfer dihydrogen to a double or triple bond

| Catalyst | Synonym | Water Solubility | Comment |
|---|---|---|---|
| (PPh$_3$)RhCl | Wilkinson's catalyst | – | Active when bound to zeolite (12 Å) |
| [(NBD)Rh(Amphos)$_2$]$^{3-}$ | | + | Cationic |
| (TPPMS)$_3$RhCl | | + | Anionic |
| (HEXNa)$_2$RhCl | | + | Anionic |
| (OCTNa)$_2$RhCl | | + | Anionic |
| IrCl(CO)(PPh$_3$)$_2$ | Vasca's complex | – | |
| (bicyclo[2.2.1]hepta-2,5-diene)[1,4-bis(diphenylphosphino)butane]rhodium(I) tetrafluoroborate | | | |

TABLE 1-continued

Hydrogenation catalysts that transfer dihydrogen to a double or triple bond

| Catalyst | Synonym | Water Solubility | Comment |
|---|---|---|---|
| (structure) P(Ph)$_3$ | | | |
| (structure) | HEXNa | | |
| (structure) | TPPMS | | |
| (structure) | OCTNa | | |
| (structure) | TPPTS | | |
| (structure) | Amphos | | |
| (structure) | NBD=Norbornadiene | | |

It has been found that rhodium catalysts are particularly useful in the hydrogenation step, most particularly those rhodium catalysts comprising phosphine groups.

The reaction mechanism of hydrogenation of ethylene with Wilkinson's catalyst is shown by way of example in FIG. 2 of WO99/24080. Reversibility of reaction is found to be low with such catalysts containing cyclic phosphines.

A further catalytic cycle is shown by way of example in FIG. 3 of WO99/24080. The oxidative addition of o-$D_2$ enriched hydrogen to the catalyst is generally an equilibrium step which means that certain catalysts will also interconvert p-$D_2$ and o-$D_2$. It is therefore desirable that the chosen hydrogenatable MR imaging agent precursor is highly reactive.

It is highly desirable to carry out the o-$D_2$ hydrogenation step in a very low magnetic field or alternatively to expose the hydrogenated agent to a very low magnetic field after (preferably immediately after) hydrogenation, e.g. by passage through a low field zone. If the low field treatment is performed after the hydrogenation step, is should be performed under non-adiabatic conditions. In reality, this means that the sample should move quickly in and out of the low field. By "quickly" it is meant faster than one second, preferably faster than 0.1 sec. Preferably this very low magnetic field is lower than the magnetic field of the earth itself, that is lower than 50 $\mu$T, more preferably less than 10 $\mu$T, even more preferably less than 2 $\mu$T, e.g. 0 to 1 $\mu$T, especially 0.3 to 1 $\mu$T. It is possible to create such low magnetic fields using, for example, commercially available magnetic shielding, for example $\mu$-metal. A 0.5 $\mu$T field can be created using a tube having twin $\mu$-metal walls. Alternatively a low-field container as described in WO99/17304 may be used with the o-$D_2$ hydrogenated being performed within the container or the hydrogenation product being passed through the container. The disclosures of WO99/17304 are incorporated herein by reference. The effect of the magnetic field on the degree of polarization of a reporter nucleus (in this case a $^{13}C$ nucleus) is shown in FIG. 1 of WO9/24080.

Most imaging agents will require this low magnetic field treatment for one of two reasons; first that this promotes polarization transfer from the introduced $^1H$ or $^2H$ nuclei to the imaging nuclei (e.g. $^{13}C$, $^{15}N$, etc.) and secondly as the treatment transforms the lineshape of the MR signal from an anti-phase multiplet with zero intergral to a multiplet with a net signal which is good for imaging.

The hydrogenation reaction is preferably performed in an organic solvent, e.g. acetone or $d_6$-acetone, in which the hydrogenatable precursor (and preferably the hydrogenated MR imaging agent and also preferably the hydrogenation catalyst) is soluble, with the solvent subsequently being removed by flash-spray distillation. Also preferably the hydrogenation is affected by spraying a solution of the precursor and catalyst into the o-$D_2$ enriched hydrogen. Such a process and apparatus therefor are described in our copending British patent application No. 9911681.6, entitled "Process" filed on the same day as the present application.

It will be apparent that the degree of solubility of the hydrogenated MR imaging agent will determine how rapidly it can be dissolved in administrable media and subsequently administered and, given the finite lifetime of the polarisation, the importance of these factors will be clear. Thus in one embodiment hydrogenation is conveniently performed in aqueous media and in this event the preferred catalysts for use in the invention should operate efficiently in water and conveniently not facilitate the exchange of hydrogen atoms ($^1H$ or $^2H$) between water and the enriched hydrogen, otherwise the polarisation is quickly lost. A water soluble rhodium catalyst is one preferred example.

In order to facilitate rapid separation-of catalyst and hydrogenated MR imaging agent after hydrogenation, the catalyst may preferably be one which is immobilized on a solid material e.g. a polymeric material which allows the catalyst-bound solid material to be rapidly filtered off after reaction. Known examples useful for the present method include catalysts covalently linked to a support or adsorbed on silica.

An alternative way to remove catalyst from solution is to run the reaction in the presence of a water-soluble catalyst (e.g. a rhodium catalyst) which may then be removed by filtration through an ion-exchange resin (preferably a strongly acidic, slightly cross-linked resin, e.g. a sodium ion loaded sulphonated polystyrene cross-linked with 2% divinyl benzene) or any other sort of filter that can retain the catalyst and allow the product to pass. In the preferred case of a cationic catalyst, filtration may be carried out through a cation exchanger. Particularly preferred catalysts are cationic rhodium catalysts. Rhodium catalysts are advantageous as they transfer hydrogen as a unit to one substrate molecule. One such embodiment makes use of an ion-exchange resin bound cationic complex such as [(NBD)Rh(Amphos)]$^{3+}$. The aqueous solution of an anionic or neutral product is obtained in the filtrate. The opposite procedure may of course be used for anionic catalysts but these are generally less preferred. A neutral catalyst may be separated from the MR imaging agent by making use of physical characteristics such as lipophilicity. For example, a lipophilic catalyst (e.g. Wilkinson's catalyst) may be used in a biphasic system such as water/$C_{19}$-derivatised silica or even two immiscible liquids such as water/heptane.

Hydrogenation may take place in a non-aqueous media in which the o-$D_2$ hydrogenation product is insoluble (i.e. from which it precipitates). The increased $T_1$ of the solid MR imaging agent allows more time for isolation and subsequent dissolution in an administrable medium. Hydrogenation may also take place with the MR imaging agent precursor being insoluble in non-aqueous media but with a particle size as small as possible to increase relative surface area. The use of non-aqueous media, preferably media with non-magnetically active nuclei (e.g. $CS_2$ or $CO_2$ under supercritical conditions) advantageously reduces polarisation loss from the polarised MR imaging agent and allows the use of an extended range of catalysts.

The o-$D_2$ hydrogenation may conveniently be effected in apparatus for hydrogenation comprising:
  a reaction chamber having therein a reaction zone, said reaction chamber having a gas inlet and a gas outlet;
  a temperature controller arranged to control the temperature in said reaction zone; and
  magnetic shielding arranged about said reaction zone and sufficient to cause the magnetic field in said reaction zone to be less than 10 $\mu$T, preferably less than 1 $\mu$T.

The reaction chamber will conveniently be disposed within a generally cylindrical $\mu$-metal shield. This shield preferably has several concentric layers, e.g. a $\mu$-metal layer of relatively high permittivity surrounded by a demagnetizing layer, e.g. of copper foil, and in turn surrounded by one or more layers of $\mu$-metal of lower permittivity than the inner layer. The inner $\mu$-metal layer is preferably of $\mu$-metal of the highest available permittivity.

At each axial end, the cylindrical magnetic shield preferably extends in its axial direction beyond the reaction zone by at least the internal diameter of the shield. Although a circular cross-section is preferred, the cylindrical shield may be non-circular in cross-section, e.g. elliptical or polygonal, for example hexagonal. Where the cross-section is non-circular, the axial extension beyond the reaction zone is preferably by at least the minimum internal "diameter" (e.g. face to face spacing for a hexagonal cross section) but more preferably by at least the maximum internal diameter (e.g. corner to corner spacing for a hexagonal cross section).

The reaction zone may for example comprise a bed of beads through which hydrogen may flow upwards from a lower gas inlet and through which a solution containing hydrogenatable precursor and hydrogenation catalyst may pass down to be removed from the reaction chamber through a lower product outlet. Alternatively, the beads may have the catalyst immobilized thereon so that the product solution is catalyst free and may be in a form ready to use. The beads are preferably formed from paramagentic material free polymer, glass or silica or are of a non-magnetic metal. Selection of bead size (e.g. 0.5 to 5 mm diameter, preferably 2 mm), bed depth and choice of direction of hydrogen flow will determine the duration of the reaction (generally 10 to 60 secs). The preferred duration and bed depth can be determined by routine experimentation for the selected precursor/catalyst combination.

The temperature controller will conveniently be a heating/cooling jacket disposed about the reaction zone portion of the reaction chamber and within the shield. Preferably the materials used are non-magnetic. A water- or gas-jacket is generally appropriate. A temperature sensor may be disposed in or adjacent the reaction zone if desired.

Conveniently, the reaction chamber has a precursor solution inlet above the reaction zone and an MR imaging agent solution outlet below the reaction zone. Thus in operation using this embodiment the following actions are performed:

a source of o-$D_2$ enriched hydrogen is attached to the gas inlet;

the reaction chamber is flushed with the enriched hydrogen;

water of the desired temperature is flowed through the water-jacket;

a quantity of a solution, preferably a sterile aqueous solution, of the precursor compound is introduced into the reaction chamber and into a particulate bed through which the enriched hydrogen is flowing upwardly; and the solution passing out of the bed is withdrawn from the reaction chamber, optionally after reversal of hydrogen flow direction to drive the solution out of the bed.

Where the catalyst is not immobilized on the particles of the bed, it will generally be included in the precursor solution, either in dissolved or particulate or supported form. If desired, the catalyst may be removed from the product solution, e.g. by precipitation and/or filtration or by passage over a material (e.g. an ion exchange column or lipophilic surface) which has affinity for the catalyst.

Catalyst removal clearly depends on the nature of the catalyst, the precursor, the MR imaging agent and whether the subject to be imaged is a living human or animal or not. Thus for inanimate subjects, catalyst removal may be unnecessary. In one embodiment, a hydrogenation catalyst soluble in a solvent that is imiscible with water is used and the hydrogenation reaction is carried out in water with a substrate that is soluble in organic solvents but has a distribution constant that favours water. The substrate is extracted into water that is injected i.v. In another embodiment a water-soluble polymer bound hydrogenation catalyst is used and the hydrogenation reaction is performed in water with a water-soluble substrate. The catalyst is removed by filtration prior to i.v. injection. In a third embodiment a solid polymer-bound hydrogenation catalyst is used and the hydrogenation reaction is performed in water with a water-soluble substrate. The catalyst is removed by filtration prior to i.v. injection. In a fourth embodiment a solid polymer-bound hydrogenation catalyst is used and the hydrogenation reaction is performed in water with a water-soluble substrate. The catalyst is removed by filtration prior to i.v. injection.

The withdrawal of the product solution is preferably by passage through a valve into the barrel of a syringe. The syringe may then be used to administer the MR imaging agent, e.g. by injection into a human or animal subject. The inner walls of the syringe and indeed of any apparatus components contacted by the hydrogenated MR imaging agent are preferably substantially free of paramagnetic (and ferromagnetic and ferrimagnetic) materials. Likewise the period of contact of the MR imaging agent with any surfaces between hydrogenation and administration should preferably be kept to a minimum.

In a preferred embodiment, the apparatus comprises:

(i) a reservoir of o-$D_2$ enriched hydrogen, preferably cooled, e.g. to liquid form;

(ii) a reaction chamber having a reaction zone containing a particulate bed and having a first gas inlet below said bed, a first gas outlet above said bed, a solution inlet above said bed and a solution outlet below said bed, and preferably a second gas inlet above said bed and optionally a second gas outlet below said bed (optionally since the solution outlet may function as a gas outlet);

(iii) a gas conduit from said reservoir to said first gas inlet in the reaction chamber, optionally provided with a heater to raise the temperature of gas flowing therethrough, and optionally provided with a valve to direct gas flow to said second gas inlet rather than to said first gas inlet;

(iv) a temperature controller, e.g. a water or gas jacket, disposed around said reaction chamber at at least said reaction zone; and (v) a magnetic shield disposed around said reaction chamber at at least said reaction zone.

The inlets and outlets to the reaction chamber are each preferably provided with a valve or if appropriate a septum and means for attaching vessels, e.g. the hydrogen reservoir, a syringe for receiving the MR imaging agent, a syringe containing the precursor solution, and reservoirs for receiving exhaust hydrogen (for recycling).

Such an apparatus may be set up near the MR imaging apparatus, e.g. so that the imaging agent may be manufactured "on-site" using reservoirs of p-$H_2$ enriched hydrogen supplied from the, normally distant, location where the enriched hydrogen was prepared.

Alternatively, the apparatus may be arranged for a gas phase reaction with precursor and hydrogen being introduced into the reaction zone in gas form and with the exhaust gas being cooled to separate hydrogen (which will remain gaseous), precursor, MR imaging agent, and, the hydrogenation catalyst. With different boiling points, the imaging agent, precursor and if appropriate, the catalyst may be collected separately and removed for optional formulation (e.g. dissolution in an appropriate liquid medium) and administration in the case of the MR imaging agent and for recycling or subsequent reuse in the case of other components. The catalyst could be immobilized on a surface (e.g. the surface of beads in a bed or of capillaries in a bundle of parallel capillaries) or could be included in the gas flow as a gas or as entrained droplets or particles. To ensure adequate progression of the reaction, the reaction zone could be arranged in a spiral or the like within the magnetic shield and the reaction can be performed at elevated temperature and pressure. Apparatus comprising shielding, reaction chamber, temperature controller, gas inlets, MR imaging agent separator (e.g. a condenser) and gas outlet arranged for performing the hydrogenation in the gas phase forms a further aspect of the invention.

Alternatively, and preferably, apparatus as described in our copending British patent application no. 9911681.6 "Process", the entire disclosure of which is herein incorporated by reference, is used.

In one embodiment of the method of the invention, the polarised (deuterated) MR imaging agent may be stored at low temperature e.g. in frozen form. Generally speaking, at low temperatures the polarisation is retained longer and thus polarised MR imaging agents may conveniently be stored for example in liquid nitrogen. Prior to administration, the MR imaging agent may be rapidly warmed to physiological temperatures using conventional techniques such as infrared or microwave radiation.

Viewed from a further aspect the invention provides a physiologically tolerable MR imaging agent composition comprising an MR imaging agent together with one or more physiologically tolerable carriers or excipients, said imaging agent containing at least two $^2$H nuclei or neighboring atoms and preferably nuclei of a I=½ isotope (e.g. $^1$H, $^{13}$C, $^{15}$N or $^{29}$Si), preferably (in the case of non $^1$H I=½ nuclei) at a higher than natural abundance, characterised in that at least some of said nuclei are polarized such that their nmr signal intensity is equivalent to a signal intensity achievable in a magnetic field of at least 0.1T, more preferably at least 25T, particularly preferably at least 100T, especially preferably at least 450T, e.g. at 21° C. in the same composition. Preferably the composition is sterile and is stable at a physiologically tolerable temperature (e.g. at 10–40° C.)

Polarization is given by the equation $$P = \left| \frac{N\alpha - N\beta}{N\alpha + N\beta} \right|$$

which at equilibrium is equal to $$\frac{1 - \exp(-\gamma_n^2 B_o / kT)}{1 + \exp(-\gamma_n^2 B_o / kT)}$$

where Nα is the number of spins in nuclear spin state α (e.g. +½;

N$_\beta$ is the number of spins in nuclear spin state β (e.g. -½);

γ is the magnetogyric ratio for the isotopic nucleus in question, e.g. $^{13}$C;

h is Planck's constant divided by 2π;

B$_o$ is the magnetic field;

k is Boltzmann's constant; and

T is temperature in Kelvin.

Thus P has a maximum value of 1 (100% polarization) and a minimum value of 0 (0% polarization)

Given that the method of the invention should be carried out within the time that the MR imaging agent remains significantly polarised, once hydrogenation has occurred and if desired or necessary the catalyst has been removed, it is desirable for administration of the MR imaging agent to be effected rapidly and for the MR measurement to follow shortly thereafter. This means that the sample (e.g. body or organ) should be available close to the area in which the polarisation has been carried out. If this is not possible, the material should be transported to the relevant area at low temperature.

The preferred administration route for the MR imaging agent is parenteral, e.g. by bolus injection, by intravenous or intra-arterial injection or, where the lungs are to be imaged, by spray, e.g. by aerosol spray.

Oral and rectal administration may also be used.

Where the MR imaging nucleus is other than a proton (e.g. $^2$D, $^{13}$C, etc.), there will be essentially no interference from background signals (the natural abundance of $^{13}$C, $^{15}$N, $^{29}$Si etc. being negligible) and image contrast will be particularly high. Thus the method according to the invention has the benefit of being able to provide significant spatial weighting to a generated image. In effect, the administration of a polarised non-proton MR imaging agent to a selected region of a sample (e.g. by injection) means that the contrast effect is, in general, localised to that region. The precise effect of course depends on the extent of biodistribution over the period in which the MR imaging agent remains significantly polarised. In general, specific body volumes (i.e. regions of interest such as the vascular system) into which the MR imaging agent is administered may be defined with improved signal to noise properties of the resulting images in these volumes.

Moreover, the γ-factor of carbon is about ¼ of the γ-factor for hydrogen resulting in a Larmor frequency of about 10 MHz at 1T. The rf-absorption in a patient is consequently and advantageously less than in $^1$H imaging. A further advantage of MR imaging agents containing polarised $^{13}$C nuclei is the ability to utilise large changes in chemical shift in response to physiological changes, e.g. pH or temperature.

In one preferred embodiment, a "native image" of the sample (e.g. body) may be generated to provide image obtained in non-proton MR imaging in the method according to the invention may be superimposed. Such a native image is generally not available where the imaging nucleus is $^{13}$C due to the low natural abundance of $^{13}$C in the body. Thus the native image may be conveniently obtained as a proton MR image in an additional step to the method of the invention.

The MR imaging agent may be conveniently formulated with conventional pharmaceutical or veterinary carriers or excipients. MR imaging agent formulations manufactured or used according to this invention may contain, besides the MR imaging agent, formulation aids such as are conventional for therapeutic and diagnostic compositions in human or veterinary medicine but will be clean, sterile and free of paramagnetic, superparamagnetic, ferromagnetic or ferrimagnetic contaminants. Thus the formulation may for example include stabilizers, antioxidants, osmolality adjusting agents, solubilizing agents, emulsifiers, viscosity enhancers, buffers, etc. Preferably none of such formulation aids will be paramagnetic, superparamagnetic, ferromagnetic or ferrimagnetic. The formulation may be in forms suitable for parenteral (e.g. intravenous or intra-arterial) or enteral (e.g. oral or rectal) application, for example for application directly into body cavities having external voidance ducts (such as the lungs, the gastrointestinal tract, the bladder and the uterus), or for injection or infusion into the cardiovascular system. However solutions, suspensions and dispersions in physiological tolerable carriers (e.g. water) will generally be preferred.

For use in in vivo imaging, the formulation, which preferably will be substantially isotonic, may conveniently be administered at a concentration sufficient to yield a 1 micromolar to 1M concentration of the MR imaging agent in the imaging zone; however the precise concentration and dosage will of course depend upon a range of factors such as toxicity, the organ targeting ability of the MR imaging agent, and the administration route. The optimum concentration for the MR imaging agent represents a balance between various factors. In general, optimum concentrations would in most cases lie in the range 0.1 mM to 10M, especially 0.2 mM to 1M, more especially 0.5 to 500 mM. Formulations for intravenous or intraarterial administration would preferably contain the MR imaging agent in concentrations of 10 mM to 10M, especially 50 mM to 500 mM. For bolus injection the concentration may conveniently be 0.1 mM to 10M, preferably 0.2 mM to 10M, more preferably 0.5 mM to 1M, still more preferably 1.0 mM to 500 mM, yet still more preferably 10 mM to 300 mM.

Parenterally administrable forms should of course be sterile and free from physiologically unacceptable agents and from paramagnetic, superparamagnetic, ferromagnetic or ferrimagnetic contaminants, and should have low osmolality to minimize irritation or other adverse effects upon administration and thus the formulation should preferably be isotonic or slightly hypertonic. Suitable vehicles include aqueous vehicles customarily used for administering parenteral solutions such as Sodium Chloride solution, Ringer's solution, Dextrose solution, Dextrose and Sodium Chloride solution, Lactated Ringer's solution and other solutions such as are described in Remington's Pharmaceutical Sciences, 15th ed., Easton: Mack Publishing Co., pp. 1405–1412 and 1461–1487 (1975) and The National Formulary XIV, 14th ed. Washington: American Pharmaceutical Association (1975). The compositions can contain preservatives, antimicrobial agents, buffers and antioxidants conventionally used for parenteral solutions, excipients and other additives which are compatible with the MR imaging agents and which will not interfere with the manufacture, storage or use/of the products.

Where the MR imaging agent is to be injected, it may be convenient to inject simultaneously at a series of administration sites such that a greater proportion of the vascular tree may be visualized before the polarisation is lost through relaxation. Intra-arterial injection is useful for preparing angiograms and intravenous injection for imaging larger arteries and the vascular tree.

The dosages of the MR imaging agent used according to the method of the present invention will vary according to the precise nature of the MR imaging agents used, of the tissue or organ of interest and of the measuring apparatus. Preferably the dosage should be kept as low as possible whilst still achieving a detectable contrast effect. Typically the dosage will be approximately 10% of $LD_{50}$, eg in the range 1 to 1000 mg/kg, preferably 2 to 500 mg/kg, especially 3 to 300 mg/kg.

Once the MR imaging agent has been administered to the subject, the chosen procedures for detecting MR signals are that which is well-known from conventional MR scanning. It is advantageous to use fast single shot imaging sequences e.g. EPI, RARE or FSE.

In conventional $^1$H-nmr imaging, the polarization which is responsible for the MR signal derives from the equilibrium polarization at the magnetic field of the primary magnet of the MR imaging apparatus. After an imaging sequence, this polarization (the magnetization in the z direction) is recovered by $T_1$ relaxation. By contrast where the MR signal derives from hyperpolarization of the reporter nuclei (e.g. $^{13}$C, $^3$He, $^{129}$Xe, $^{15}$N, $^{29}$Si, etc), the hyperpolarization cannot be recovered and the MR signal following a 90° RF pulse must be recovered by a train of 180° RF pulses.

Where however the hyperpolarization results from hydrogenation with parahydrogen imaging sequences as described in WO99/24080 may be used.

Where the method of the invention is used for $^2$H-MR imaging, the o-$D_2$ hydrogenation and subsequent MR imaging agent handling preferably does not involve a low magnetic field treatment and the following MR imaging sequence may be used.

In a standard CPMG-sequence, the 1800 RF pulses are phase shifted $\pi/2$ relative to the 90° RF pulse, e.g. 90°x–180°y–180°y– . . . ; this arrangement is preferred for the imaging sequence described in WO99/24080.

Thus using an initial focussing delay makes it feasible to image a contrast agent with two anti parallel resonance lines as would be achieved by hydrogenation with ortho-deuterium. In general, it is preferable to use pulse sequences that lead to non-cancellation of the components of the magnetization.

Where the method of the invention is used for I=½ nuclei MR imaging (e.g. $^1$H, $^{13}$C, etc. MR imaging), the o-$D_2$ hydrogenation is preferably effected in a low magnetic field and/or the MR imaging agent is subjected to a low magnetic field treatment and MR imaging may be effected using above-mentioned MR sequences.

In place of o-$D_2$ enriched hydrogen, the invention may be performed using acetylene or other materials having nuclear spin isomers, preferably hydrogen nuclear spin isomers, such as p-acetylene ($H^{12}C^{12}CH$), o-deuteroacetylene ($D^{12}C^{12}CD$) or p-nitrogen (p-$^{15}N^{15}N$), the relative populations of which are changed by cooling to below liquid nitrogen temperatures, and more particularly to below 20K, even more particularly to between 0.1 to 1K, and still more particularly to milliKelvin temperatures, and substrates which are reactive therewith to incorporate the spin isomers into a single molecular entity. This forms a further aspect of the invention.

Together with WO99/24080, the combined invention comprises all methods, processes, uses and apparatus wherein a compound, preferably a hydrogen containing compound, having nuclear spin isomers the relative populations of which are altered by cooling to below ambient temperature, e.g. to below 80K or more preferably below 30K, e.g. 20K or below (e.g. $^1H_2$ or $^2H_2$ or mixtures thereof) is enhanced in one such isomer (e.g. o-$D_2$ and/or p-$^1H_2$) and reacted with a substrate compound whereby to form a MR imaging agent containing at least two atoms, preferably hydrogens, deriving from the compound, preferably hydrogen containing compound and, in the case that the hydrogen containing compound is $H_2$ gas, either pure or containing deuterium in its normal abundance, containing at least one non-zero nuclear spin nucleus, preferable at least one non-$^1$H non-zero nuclear spin nucleus, more preferably at least one spin ½ (I=½) nucleus.

The contents of all publications referred to herein are hereby incorporated by reference.

Embodiments of the invention are described further with reference to the following non-limiting Examples and the accompanying drawings, in which:

FIG. 1 is a plot of o-$D_2$ abudance at equilibrium against temperature; and

FIGS. 2a and 2b and 3a and 3b are plots of simulated MR spectrum for a DD spin system with 45 and 90° flip angles without (FIG. 2) and with (FIG. 3) a low magnetic field treatment.

EXAMPLE 1

The following reactions are performed and produce the enhancement effects mentioned.

(A) Ph—C≡CH+o-$D_2$ and homogeneous rhodium catalyst.

(B) EtOOC—C≡COOEt+o-$D_2$ and homogeneous rhodium catalyst, converting about 100% in about 20 seconds to the cis C=C product.

(C) R—CH=CH—COOH+o-$D_2$ and a resin bound rhodium catalyst in water, converting about 75% in 8 minutes to RCHDCDCOOH (where R is H or COOH).

EXAMPLE 2

Low-field Enhancement of the o-$D_2$ Signal

Acetylene dicarboxylic acid dimethyl ester (0.5 g) with a natural abundance of $^{13}C$, and (bicyclo[2.2.1]hepta-2,5-diene)[1,4-bis(diphenylphosphino)butane]rhodium(I) tetrafluoroborate (0.12 mmol) in a solution of deuteroacetone (5 ml) is hydrogenated with deuterium gas enriched in o-$D_2$ (80%) for 20 seconds with a jacket temperature of 42° C. in the hydrogenation reactor described in British Patent Application No. 9911681.6 (supra) in connection with FIGS. 1–3 with the magnetic screen in place.

The aqueous solution is transferred to an nmr-tube and, following a 90° pulse, a spectrum is recorded at the $^{13}C$. frequency in a 7T NMR-spectrometer within 20 seconds after the reaction is finished.

In another experiment the sample solution is transferred to a glass vial and imaged using a standard RARE-sequence.

EXAMPLE 3

Imaging of the o-$D_2$ Enhanced Signal in Phantoms

Acetylene, dicarboxylic acid dimethyl ester (0.5 g) with a natural abundance of $^{13}C$, and (bicyclo [2.2.1]hepta-2,5-diene)[1,4-bis(diphenylphosphino)butane]rhodium(I) tetrafluoroborate (0.12 mmol) in a solution of deuteroacetone (5 ml) is allowed to react with deuterium gas enriched in ortho-deuterium for 40 seconds in a jacketed reactor with the gas entering through a frit at the bottom of the reactor. The jacket temperature is kept at 40° C. The reactor is enclosed in a cylindrical double walled $\mu$-metal screen.

In one experiment the sample is then transferred to an NMR tube and rapidly (less than 20 secs from finishing the reaction) placed in the magnet of an NMR spectrometer and an enhanced $^{13}C$ image is recorded.

In another experiment the sample is transferred to a glass vial and imaged at the $^{13}C$ frequency in an MRI-instrument using a standard RARE-pulse sequence. An enhanced $^{13}C$ image is obtained.

EXAMPLE 4

Imaging of the o-$D_2$ Enhanced Signal in Phantoms

Acetylene dicarboxylic acid dimethyl ester (0.5 g) with a natural abundance of $^{13}C$, and (bicyclo [2.2.1]hepta-2,5-diene)[1,4-bis(diphenylphosphino)butane]rhodium(I) tetrafluoroborate (0.12 mmol) in a solution of deuteroacetone (5 ml) is allowed to react with deuterium gas enriched in ortho-deuterium for 40 seconds in a jacketed reactor with the gas entering through a frit at the bottom of the reactor. The jacket temperature is kept at 40° C. The reactor is kept in the normal earth-magnetic field.

In one experiment the sample is then transferred to an NMR tube and rapidly (less than 20 secs from finishing the reaction) placed in the magnet of an NMR spectrometer and an enhanced deuterium spectrum is recorded.

In another experiment the sample is transferred to a glass vial and imaged at the deuterium frequency in an MRI-instrument using the modified RARE-pulse sequence described earlier. The initial delay is set to 100 ms. An enhanced deuterium image is obtained.

EXAMPLE 5

Imaging of the o-$D_2$ Enhanced Signal in Rat

Acetylenene dicarboxylic acid dimethyl ester-1-$^{13}C$(99%) (6 mmol), and (bicyclo[2.2.1]hepta-2,5-diene)[1,4-bis(diphenylphosphino)butane]rhodium(I) tetrafluoroborate (0.23 mmol) in a solution of deuteroacetone (10 ml) is hydrogenated with deuterium gas enriched in o-D. (80%) for 20 seconds with a jacket temperature of 42° C. in the hydrogenation reactor described in Example 2.

The sample is transferred to a syringe and injected into the stomach of a rat. The rat is then placed in the imaging magnet and a $^{13}C$-MR picture is recorded. As a reference, the proton image of the rat in the same position is also obtained. A control experiment where the $^{13}C$-MR imaging pulse sequence is repeated after relaxation of the contrast agent is also performed.

What is claimed is:

1. A method of magnetic resonance investigation of a sample, said method comprising:
   (i) reacting ortho-deuterium enriched hydrogen with a hydrogenatable MR imaging agent precursor to produce a hydrogenated MR imaging agent;
   (ii) administering said hydrogenated MR imaging agent to said sample;
   (iii) exposing said sample to radiation of a frequency selected to excite nuclear spin transitions of selected non-zero nuclear spin nuclei in said hydrogenated MR imaging agent;
   (iv) detecting magnetic resonance signals of said selected non-zero nuclear spin nuclei from said sample.

2. A method as claimed in claim 1 wherein said precursor contains a hydrogenatable unsaturated bond.

3. A method as claimed in claim 1 wherein said precursor contains a non-zero nuclear spin nucleus.

4. A method as claimed in claim 3 wherein said nucleus is a non-zero nuclear spin nucleus other than $^1H$.

5. A method as claimed in claim 4 wherein said nucleus is a spin ½ (I=½) nucleus.

6. A method as claimed in claim 3 wherein the content of the nuclei in said agent is enriched.

7. A method as claimed in claim 1 wherein the magnetic field in step (ii) is less than 5 $\mu T$.

8. A method as claimed in claim 1 wherein the magnetic field is less than 1 $\mu T$.

9. A method as claimed in claim 1, wherein said precursor:
   (i) contains a hydrogenatable unsaturated bond;
   (ii) contains a non-zero nuclear spin nucleus having high natural abundance or at greater than natural isotopic abundance;
   (iii) has a molecular weight below 1000D; and
   (iv) which following hydrogenation with a o-$D_2$ has an nmr spectrum for said non-zero nuclear spin nucleus which is a multiplet having a coupling constant relative to one of the deuteriums introduced by hydrogenation of 0.1 to 300 Hz and having a linewidth of less than 100 Hz.

10. The method as claimed in claim 9 wherein said precursor has a molecular weight below 500 D.

11. The method as claimed in claim 9 wherein said linewidth is below 10 Hz.

12. The method as claimed in claim 9 wherein said line width is below 1 Hz.

13. The method as claimed in claim 9 wherein said precursor contains as said non-zero nuclear spin nucleus, $^{13}$C.

14. The method as claimed in claim 9 wherein said precursor contains the following molecular sub-units:
   (i) at least one C=C or C≡C bond;
   (ii) a C, N or Si atom separated by one or two bonds from a C=C or C≡C bond, bound only to atoms the naturally most abundant isotope form of which has a nuclear spin I=0, and not coupled by a series of covalent bonds to any atoms the naturally most abundant isotopic form of which has I>½; and
   (iii) at least one water-solubilizing moiety, i.e. a functional group which imparts water solubility to the molecule groups.

15. A method as claimed in claim 1, which comprises subjecting said hydrogenated MR imaging agent to a low magnetic field after step (i) and before step (ii).

16. A method as claimed in claim 1, which comprises generating an image or biological functional data or dynamic flow data from said detected signals.

17. A method as claimed in claim 1, which comprises subjecting said hydrogenated MR imaging agent to a low magnetic field after step (i) and before step (ii) and generating an image or biological functional data or dynamic flow data from said detected signals after step (v).

18. In a method of MR imaging a sample in which an MR contrast agent is administered to a subject and the subject containing the contrast image is subjected to MR imaging, wherein the improvement comprises reacting a precursor to the agent with ortho-deuterium enriched hydrogen to produce the contrast agent to be administered to the subject.

19. The method of claim 18, wherein the MR imaging is $^{13}$C $^{15}$N or $^{1}$H imaging.

* * * * *